(12) United States Patent
Van Der Ploeg et al.

(10) Patent No.: US 8,284,091 B2
(45) Date of Patent: Oct. 9, 2012

(54) FLASH ANALOG-TO-DIGITAL CONVERTER

(75) Inventors: Hendrik Van Der Ploeg, Waalre (NL);
Erwin Janssen, Veldhoven (NL);
Konstantinos Doris, Amsterdam (NL)

(73) Assignee: Integrated Device Technology, Inc.,
San Jose, CA (US)

( * ) Notice: Subject to any disclaimer, the term of this patent is extended or adjusted under 35 U.S.C. 154(b) by 34 days.

(21) Appl. No.: 12/933,410

(22) PCT Filed: Mar. 17, 2009

(86) PCT No.: PCT/IB2009/051132
§ 371 (c)(1),
(2), (4) Date: Sep. 18, 2010

(87) PCT Pub. No.: WO2009/115990
PCT Pub. Date: Sep. 24, 2009

(65) Prior Publication Data
US 2011/0012771 A1    Jan. 20, 2011

(30) Foreign Application Priority Data
Mar. 19, 2008    (EP) .................................... 08102781

(51) Int. Cl.
*H03M 1/36* (2006.01)
(52) U.S. Cl. ........................................ 341/159; 341/120
(58) Field of Classification Search .................. 341/120, 341/159
See application file for complete search history.

(56) References Cited

U.S. PATENT DOCUMENTS

| | | | | |
|---|---|---|---|---|
| 5,450,085 A | * | 9/1995 | Stewart et al. ................. | 341/159 |
| 5,835,046 A | * | 11/1998 | Larsson et al. ................. | 341/155 |
| 5,861,829 A | * | 1/1999 | Sutardja ........................ | 341/122 |
| 6,101,376 A | * | 8/2000 | Bell .............................. | 455/218 |
| 6,188,347 B1 | | 2/2001 | Knudsen | |

(Continued)

FOREIGN PATENT DOCUMENTS

WO    2006000987 A1    1/2006

OTHER PUBLICATIONS

Huang, et al; "A Background Comparator Calibration Technique for Flash Analog-To-Digital Converters"; IEEE Transactions on Circuits and Systems—1: Regular Papers; vol. 52, No. 9; pp. 1732-1739 (Sep. 2005).

(Continued)

*Primary Examiner* — Khai M Nguyen
(74) *Attorney, Agent, or Firm* — Haynes and Boone, LLP

(57) ABSTRACT

An analog-to-digital converter comprises a signal input (6) for receiving an analog input signal and a set of comparators (4). Each comparator (4) has a first input (21) connected to the signal input (6) and a second input (22) connected to a reference voltage (16). Each comparator generates an output based on the comparison of the signals at the first input (21) and second input (22). The reference voltage is the same for all comparators. The set of comparators (4) has a non-identical response to the reference voltage (16) and the input signal and is due to an internally arising offset. An adder (25) determines a sum of the outputs of the set of comparators and conversion logic (27) generates an output digital signal dependent on the determined sum. Multiple sets of comparators can be provided, each set having a different respective reference voltage.

12 Claims, 6 Drawing Sheets

U.S. PATENT DOCUMENTS

| | | | |
|---|---|---|---|
| 6,373,423 B1 * | 4/2002 | Knudsen | 341/159 |
| 6,445,319 B1 | 9/2002 | Bugeja | |
| 6,603,416 B2 * | 8/2003 | Masenas et al. | 341/155 |
| 6,606,048 B1 * | 8/2003 | Sutardja | 341/158 |
| 6,993,441 B1 | 1/2006 | Tsyrganovich | |
| 7,161,523 B1 * | 1/2007 | Zortea | 341/120 |
| 7,233,274 B1 | 6/2007 | Kuhn | |
| 7,652,600 B2 * | 1/2010 | Van der Plas et al. | 341/120 |
| 2004/0080444 A1 | 4/2004 | Meyers et al. | |

OTHER PUBLICATIONS

International Search Report and Written Opinion for Application PCT/IB2009/051132 (Mar. 17, 2009).

* cited by examiner

FLASH ANALOG-TO-DIGITAL CONVERTER

This invention relates to analog-to-digital converters.

A flash analog-to-digital converter (ADC), also known as a direct conversion ADC, is a device which is capable of outputting a digital code representing the level of an input analog signal. FIG. 1 shows the typical structure of a flash ADC. An input signal Si, in the analog domain, is received at an input 6. The device comprises a set of comparators 4, arranged in parallel with one another. Each of the set of comparators 4 receives the input signal Si on one input and a reference signal on another input. Each comparator receives a different reference signal. In FIG. 1 this is achieved by a ladder network of resistors 3 arranged in series between a supply line 7 carrying a reference voltage $V_H$ and a supply line 8 carrying a reference voltage $V_L$. The ladder network has the effect of creating a different reference voltage at each node 5. Each comparator compares the input signal with the respective reference level of that comparator, and outputs a decision. Logic 9 receives decisions of the comparators 4 and converts this into a digital code representing the signal level of the analog input signal Si. Standard N-bit flash ADCs require $2^N$ reference levels and $2^N$ comparators.

A Flash ADC has an advantage of providing a fast conversion, compared to other types of ADC. The accuracy of a flash ADC (i.e. how accurately the digital code output by the ADC corresponds to the level of the input analog signal) is determined by a number of factors. One important factor is the number of reference levels, since the ADC can only resolve the input signal to one of the available reference levels. Input signals falling in the range between two adjacent reference levels can only be resolved to one of the two adjacent reference levels. Other factors include the accuracy of the comparators themselves; and the accuracy of the reference levels applied to each comparator. The performance of an ADC is typically expressed as a Signal to Noise and Distortion Ratio (SINAD).

Building an accurate comparator is not trivial and requires either large transistors or means for calibrating each comparator. If large transistors are used, the input capacitance of the converter increases, making the transistor more difficult to drive and reducing the maximum operation speed, as well as requiring a larger silicon area, which increases cost and device size. Calibration per comparator requires a lot of additional circuitry and complexity. There is a practical limit to the number of bits that can be resolved at a certain combination of speed/bandwidth. Generally, it has been found that there is a practical maximum value of N=6 (i.e. resolving to 6-bits) for high-speed, large bandwidth, conversion. Higher accuracy requirements for the comparators also translate into increased power consumption.

In modern wide-band communication systems the input signal to an ADC comprises a multitude of channels which causes the input signal to have a gaussian-shaped amplitude distribution. Therefore, the input signal is located most of the time around zero and thus the most stringent accuracy requirements are in the middle of the signal range. This is in contrast to small bandwidth systems with sine wave shaped input signals. WO2006/000987 describes a flash ADC with a non-linear ladder network. This provides improved accuracy in certain amplitude ranges, such as around the zero crossing point, which can be beneficial for wide-band signals. However, this type of converter will still suffer from the other disadvantages of conventional flash ADCs described above.

The present invention seeks to provide an analog-to-digital converter which addresses at least one of these shortcomings.

A first aspect of the present invention provides an analog-to-digital converter comprising:

a signal input for receiving an analog input signal;

a set of comparators, each comparator having a first input connected to the signal input, a second input connected to a reference voltage and being arranged to generate an output based on the comparison of the signals at the first input and second input, wherein the reference voltage is the same for all comparators in the set, and wherein the set of comparators have a non-identical response to the reference voltage and the input signal;

an adder for determining a sum of the outputs of the set of comparators;

conversion logic which is arranged to generate an output digital signal dependent on the determined sum.

The term "non-identical response" means that the comparators do not all generate the same output when the same combination of input signal and reference voltage is presented to each of the comparators. This non-identical response is due to the comparators having an internally arising offset. This offset has the effect of causing the comparator to provide an output when the signals present on the inputs of the comparator differ by the offset value, rather than when the signals present on the inputs of the comparator are exactly equal. The internal offset can be represented as an equivalent offset on one of the two input terminals of the comparator. The set of comparators has a spread of different offset values. For some comparators the offset will be zero, but overall the set of comparators will have a range of offset values which is distributed each side of zero. Offset is usually considered an undesirable feature of a comparator but, in this invention, it is used in a positive way. There are two main ways in which the non-identical response can arise. In a first way, the set of comparators are designed to have an identical response but their response becomes, in practice, non-identical due to IC fabrication mismatches and process spread. In a second way, the set of comparators are purposely designed to be non-identical, which has the consequence that the responses are non-identical so, for example, some of the comparators will have more spread than others because they were designed that way.

To provide an advantageous input range for the converter it is desirable that the comparators have a wide spread of offset values. The ADC can use comparators which are physically very small as they are not required to provide a high level of accuracy. The wide spread of offset values can be achieved by using smaller, less accurate, comparators than a conventional Flash ADC. The smaller comparators have an additional advantage of a lower input capacitance, which makes the device easier to drive, and allows the device to respond quickly to an input signal. Although the ADC advantageously has a higher number of comparators than a conventional flash ADC, the use of smaller transistors in the device requires less overall silicon area compared to a conventional flash ADC. This reduces the cost of the device.

Advantageously, the converter comprises N sets of comparators (where N is an integer >=2) and each of the N sets of comparators is provided with a different reference voltage. The adder is arranged to determine a sum of the outputs of all of the comparators. This has the advantage of increasing the input range of the converter. Advantageously, a first of the reference voltages is substantially equal to zero, and the other reference voltages are distributed (equally) each side of the first reference voltage.

Each set of comparators advantageously comprises a substantially equal number of comparators. Preferably, there is a reasonably large number of comparators in each set to provide a good spread of offset values. A set of the order of ten, or tens, of comparators can provide advantageous results, although the number of comparators per set could be much larger, or even smaller, than this.

Advantageously, the conversion logic comprises a look-up table which stores a relationship between a range of possible values output by the adder and a corresponding digital code for each value.

The conversion logic can be calibrated by applying a set of calibration signals of known value to the signal input of the converter and recording an output of the adder for each calibration signal. The calibration apparatus can be provided locally with the converter, such as part of the same integrated circuit as the converter. This has an advantage of minimising fabrication time for the device and allows the converter to be calibrated on multiple occasions, such as each time the converter is powered up. Alternatively, the calibration apparatus can be provided as part of a test rig.

Further aspects of the invention provide a method of calibrating an analog-to-digital converter and a method of performing analog-to-digital conversion of an analog input signal.

Embodiments of the present invention will now be described, by way of example only, with reference to the accompanying drawings, in which:—

Figure 1:
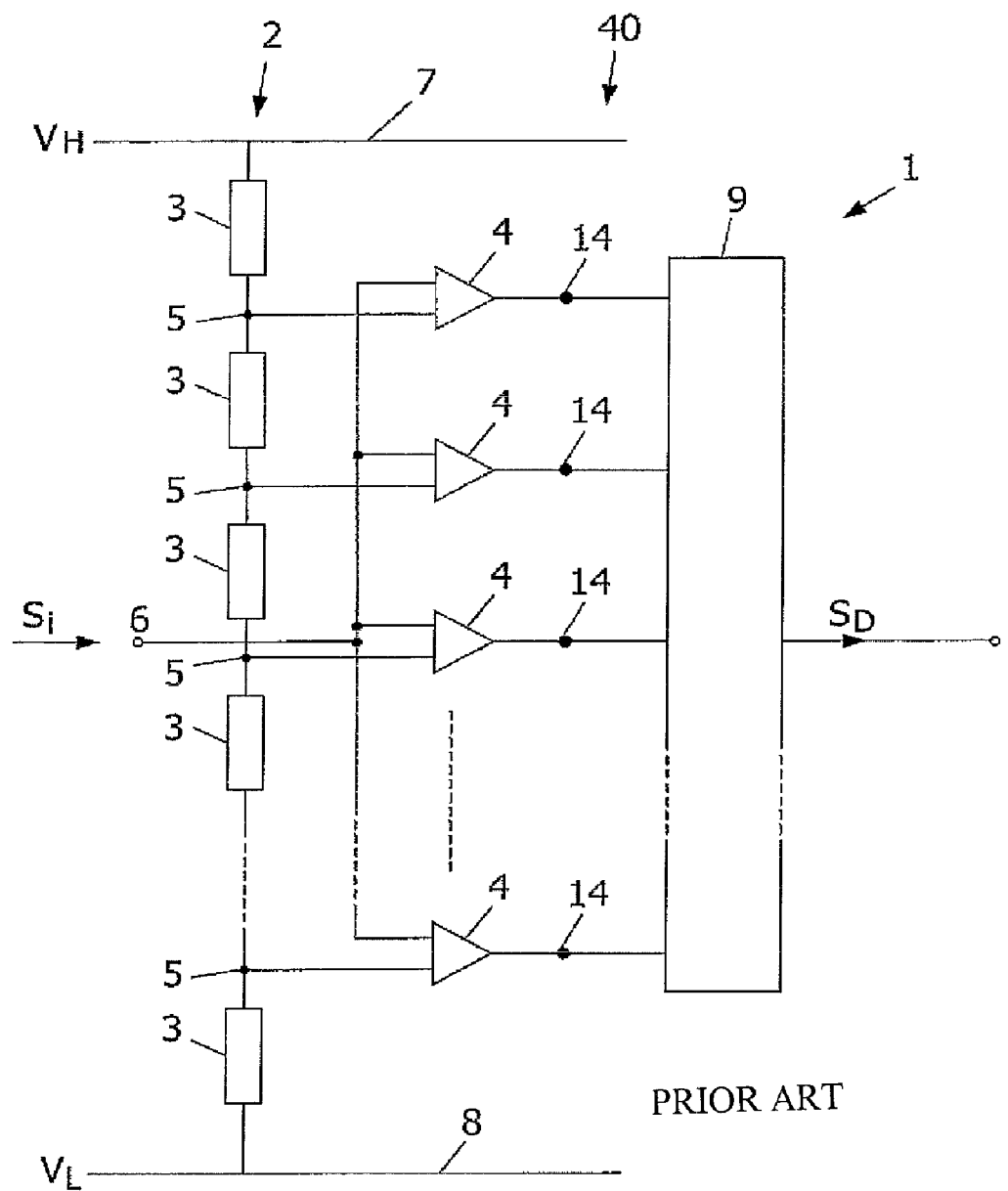
FIG. 1 shows a known flash ADC.
Figure 2:
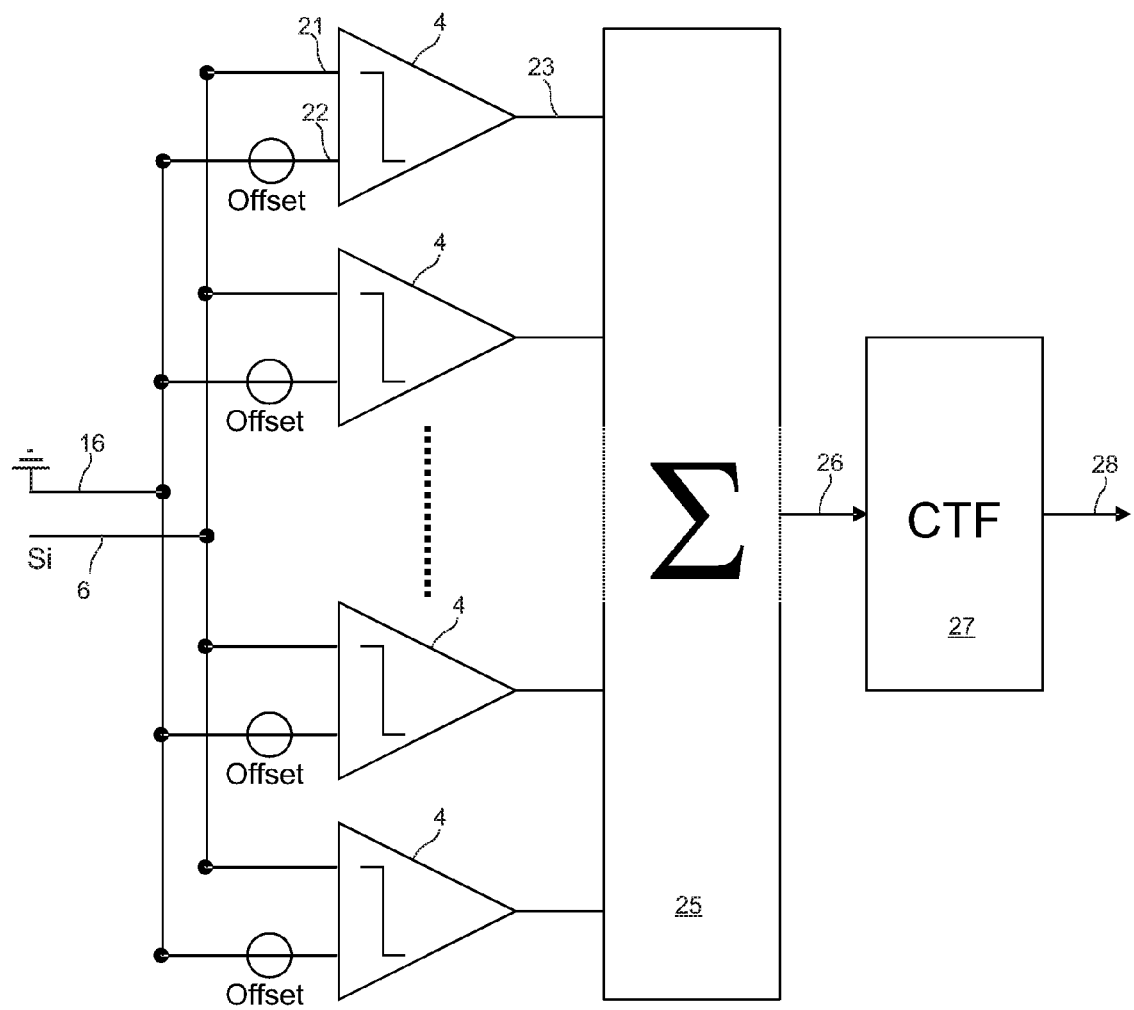
FIG. 2 shows a flash ADC according to an embodiment of the present invention in which an input of each ADC is connected to the same reference signal.

FIG. 2 shows a flash ADC in accordance with a first embodiment of the present invention. The ADC has a set of comparators 4, each having a first input 21 and a second input 22. An input signal Si is received on input terminal 6 and is connected to a respective first input 21 of each of the comparators 4. Comparing the flash ADC of FIG. 2 with the conventional flash ADC shown in FIG. 1, it can be seen that there is no ladder network of resistors. Instead, the second input 22 of each of the comparators 4 is connected to the same terminal 16 on which there is a common reference voltage level. In this example, terminal 16 is connected to ground (0V). An adder 25 is connected to the output of each comparator 4. Each comparator 4 compares the signals received on the inputs 21, 22 and generates a decision output 23. A comparator 4 generates a logical '1' when the input signal Si exceeds the reference signal, and a logical '0' when the input signal Si is less than the reference signal. In operation, adder 25 receives a decision output (a logical '1' or '0') from each of the comparators 4, sums the number of outputs, and outputs this sum 26 to logic 27. Logic 27 generates a digital code based on the number 26 received from adder 25. Logic 27 can be implemented in a variety of ways. In a first implementation, logic 27 is a look-up table with a table entry (corresponding to an output value 28) for each possible input value 26. In a second implementation, logic 27 is a look-up table with fewer entries than in the first implementation. An interpolation operation is performed by logic 27 to determine an output value 28 corresponding to an input value 26 which lies between table entries in the look-up table. In a further implementation there is no look-up table but an algorithm, such as a piecewise linear approximation or polynomial approximation function, generates an output value for any input value.

Figure 3:
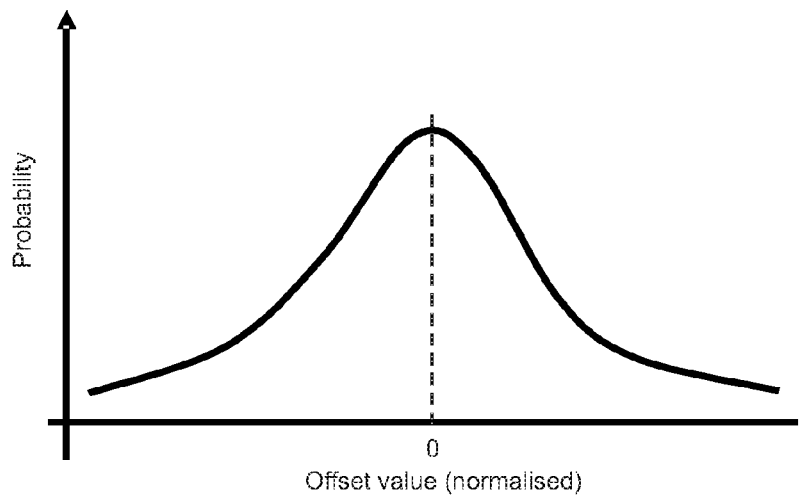
FIG. 3 shows a gaussian distribution of offset values for a set of comparators

Each of the comparators 4 in FIG. 2 is shown with an offset on one of the inputs. Ideally, a comparator has no offset and the comparator generates an output when the input exactly matches the reference level. However, a practical realisation of a comparator will exhibit some offset, and it is an unavoidable artefact arising from a practical realisation of the converter. The source of the offset is internal to the comparator. The internally-arising offset can be referred to one of the inputs, and can be represented as a positive or negative value at one of the comparator inputs. This convention is termed an "input referred offset". The offset causes a comparator 4 to generate a decision output at a value (of input voltage or input current) which is offset from the expected value. This offset voltage is determined by factors such as the size of the transistors in the comparator. Considering the set of comparators 4 in the converter, the offset value at the comparators can have a random Gaussian distribution and it may have a deterministic/systematic part. A Gaussian distribution about a mean value of zero is shown in FIG. 3 and it will be used to demonstrate the invention without however being restricted to it. FIG. 3 shows that the offset value of the comparators can be distributed each side of the ideal condition of there being no offset.

Figure 4:
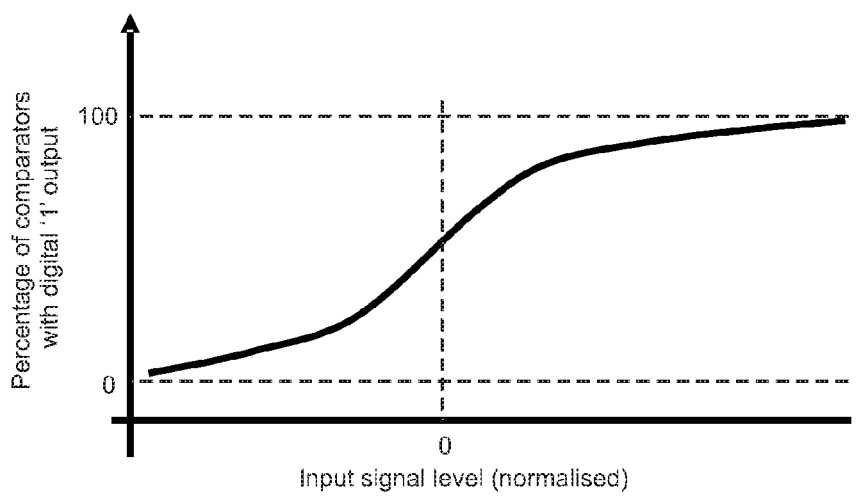
FIG. 4 shows a curve, based on the distribution of FIG. 3, which relates a percentage of comparators which will provide an output to an input signal level.
Figure 5:
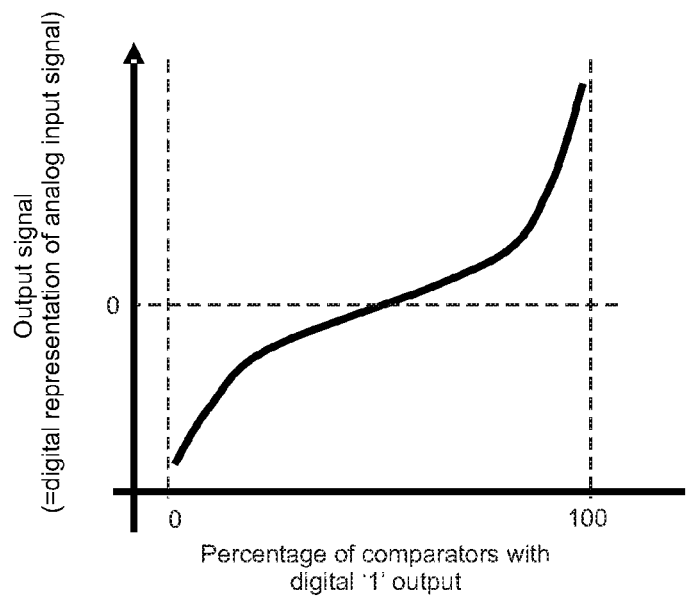
FIG. 5 shows a compensating transfer function.

Let us assume that the distribution of the offsets of the comparators 4 is perfectly Gaussian, with a mean value of zero, as shown in FIG. 3. If, under this assumption, a ramp-shaped input signal is applied to the converter of FIG. 2, and the number of comparators that have a digital '1' as an output is counted, then the resulting transfer would be similar to the one shown in FIG. 4. FIG. 4 shows how many comparators give a '1' output as a function of the input level, and therefore it maps an analog input to a digital representation thereof, which is the transfer function of the system. It is clear from FIG. 4 that the transfer from analog input signal to digital output is not linear. However the 'cumulative distribution function' of FIG. 4 can be computed, and is constant with a sufficiently large number of comparators 4. The inverse function, shown in FIG. 5, is called a compensating transfer function (CTF). The CTF performs the inverse operation to the transfer function shown in FIG. 4 and relates the number of comparators showing a '1' at the output to the applied input signal. The CTF is constructed by taking the y-axis of FIG. 4 as the input and the x-axis of FIG. 4 as the output.

The transfer function of FIG. 4 and the CTF of FIG. 5 are based on a converter having the Gaussian distribution of offset values shown in FIG. 3. The actual transfer function of a converter can vary significantly from the graphs shown in these figures, and will vary based on properties of the converter, such as transistor size. It is possible that even where converters having the same physical properties, the CTF can vary on a batch-by-batch basis or on an integrated circuit (IC) to IC basis. For best results, it is desirable to separately calibrate the compensating transfer function (CTF) of each converter, or each batch of converters.

Figure 6:
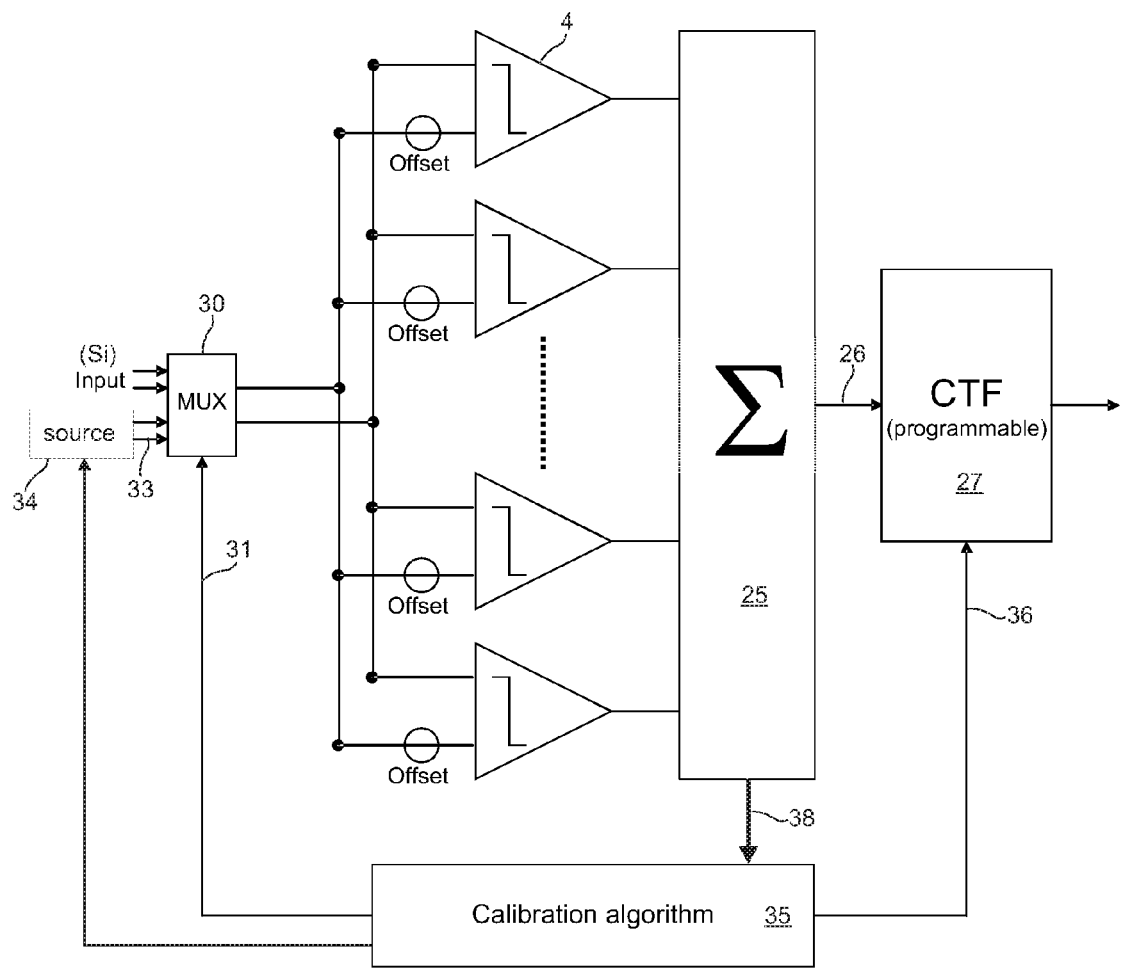
FIG. 6 shows apparatus for calibrating the converter of FIG. 3.

FIG. 6 shows suitable apparatus for calibrating the compensating transfer function of a converter. A multiplexer 30 is connected to the input of the converter. The multiplexer is controlled, via input 31, to selectively receive a signal input Si (normal operation) or a calibration input 33. Control logic 35 controls the calibration function, and outputs control signal 31 to the multiplexer and control data 36 to the logic 27 which stores the CTF. A signal source 34 generates the calibration inputs which comprise a set of known DC-levels, e.g. 0.2V, 0.4V, 0.6V etc. For each calibration input 33 applied to the input of the converter, adder 25 sums the number of comparators which generate a logical '1' at their output. For each calibration input, the calibration algorithm 35 receives an input 38 from the adder 25 indicating the number of comparators that responded to the input signal level. Calibration algorithm 35 stores the data elements (input level, number of comparators) as a table of data, and this forms the CTF. The CTF, for other input signal levels, can be derived by interpolation between the signal levels that are known. At the end of the calibration process, the table is transferred to the CTF logic 27. Alternatively, the CTF can be constructed by logic 27 during the calibration process. For each calibration input, the calibration algorithm 35 instructs logic 27 to store the calibration input level (e.g. 0.2V) and the number of comparators which responded to that input level. Another way of calibrating the converter is to apply a slow, ramp-like (i.e. linear), signal to the input terminal of the converter and to store the number of comparators with logical '1' in a memory. The ramp signal starts at a value which is out-of-range for the converter, and all comparator outputs will be '0'. Then, at some moment in time, a valid output reading is realised. The number of comparators indicating a '1' can then be recorded at equidistant moments in time. The input values are all spaced by an equal amount because the input signal is a linear ramp, and therefore the corresponding input values can be deduced easily. Once the input signal exceeds the range of the ADC, all outputs will be '1'. This condition can be detected and the calibration process is stopped.

There are several options for what calibration apparatus is provided as part of the ADC integrated circuit. One option is to perform a one-time calibration during fabrication of the IC. In this scenario, the mux 30, source 34 and calibration algorithm 35 form part of a test rig and are not integrated in the ADC IC. All calibration calculations are performed by the test rig. In terms of silicon area, this is the cheapest option but it requires additional time and expense during fabrication. An alternative option is to provide the mux 30, source 34 and calibration algorithm 35 as part of the ADC IC. Periodically, such as at start-up of the host system, the converter calibrates itself.

In one embodiment, an ADC has 2048 comparators. The ADC is calibrated by recording the number of comparators with a logical '1' for each of 256 known input levels. An interpolation process is used to calculate the number of comparators with a logical '1' for other input levels, located between the known input levels that were actually applied to the ADC.

Figure 7:
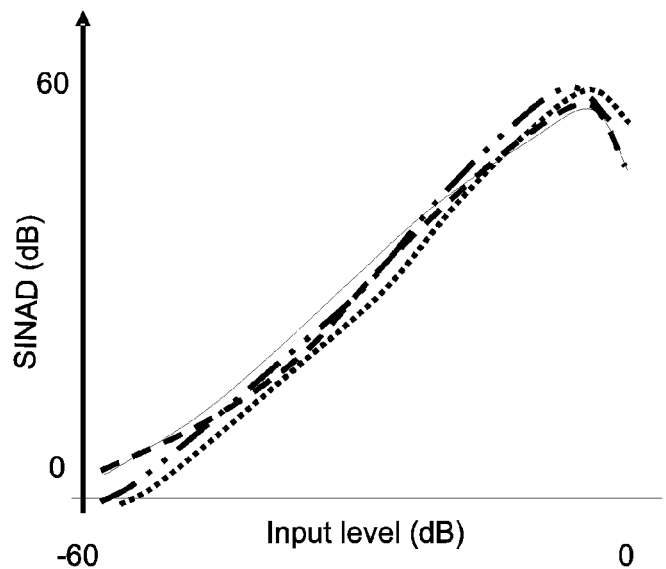
FIG. 7 shows variation in performance of a number of converters.

FIG. 7 shows a simulation result of 10 different ADCs. The Signal to Noise and Distortion Ratio (SINAD) of each of the converters is shown as a function of the input level after calibration. From FIG. 6 it is clear that the result is not very dependant on the actual distribution of the comparator offsets. It can also be seen that the SINAD is comparable to a normal 10-bit converter for small input levels, but decreases for larger input signal levels. By way of comparison, a perfect 10-bit converter would show a straight line between 0 dB and ~62 dB SINAD for a corresponding input level of −62 dB . . . 0 dB. The example curves show around 10 dB of SINAD for −50 dB inputs (30 dB for −30 dB inputs), which is comparable to the performance of a 10-bit converter. For inputs of −10 dB the SINAD is around 46 dB, which is less than a 10-bit converter would realize. For inputs larger than −5 dB the SINAD reduces, which is not flash ADC alike but sigma delta alike behaviour. The performance shown is after calibration. It is clear that the performance will vary from converter to converter.

Figure 9:
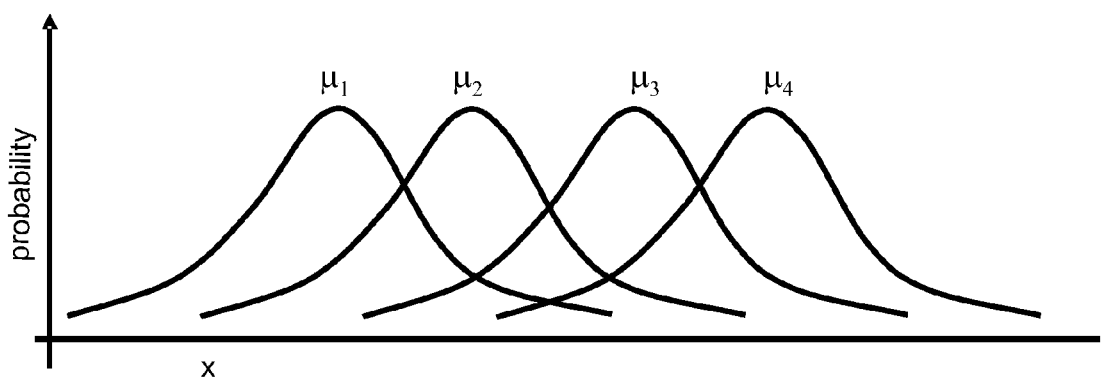
FIG. 9 shows a gaussian distribution of offset values for four groups of comparators, with the groups being offset by using a different reference voltage; and, FIG. 10 shows a combined cumulative distribution function for the individual distributions shown in FIG. 9.
Figure 10:
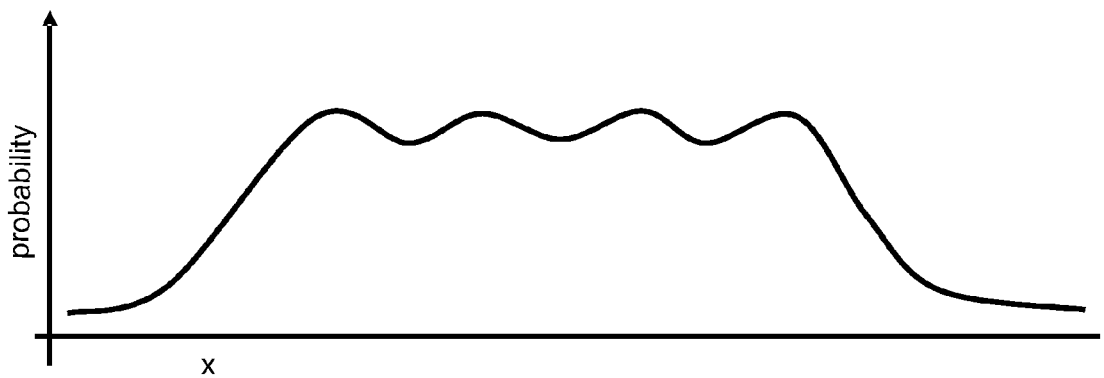
Figure 8:
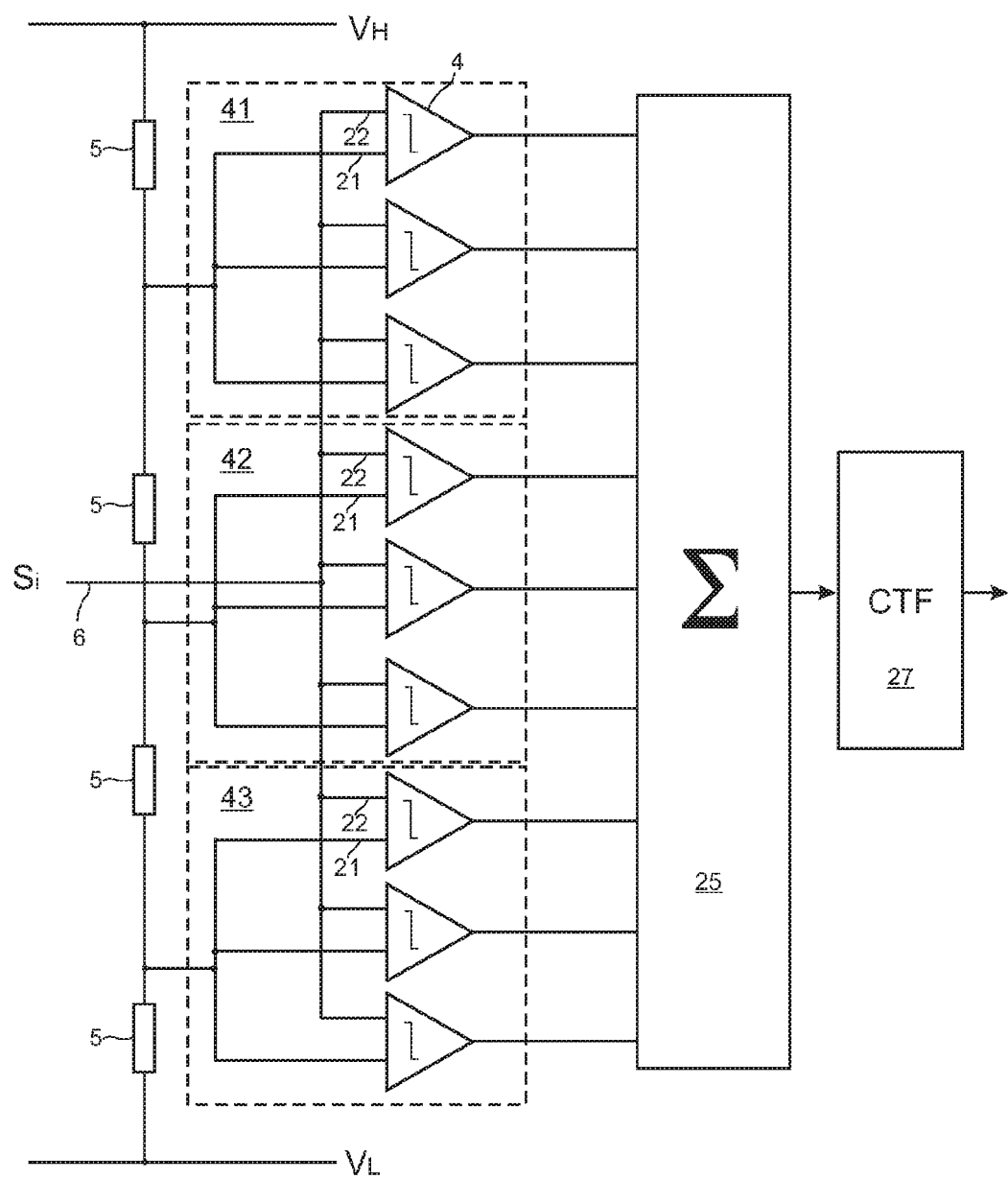
FIG. 8 shows a flash ADC according to another embodiment of the present invention in which comparators are arranged in groups and each group has a different reference level.

FIG. 8 shows a further embodiment of the invention in which the total set of comparators are divided into sub-sets 41, 42, 43. The first input 21 of every comparator is connected to the input terminal 6, and receives input signal Si. The second input terminal 22 of every comparator in a sub-set is connected to the same reference level. Each sub-set 41, 42, 43 of comparators is provided with a different reference level. In FIG. 7 the different reference levels are provided by a ladder network of resistors 5 connected in series between a supply line which carries the voltage $V_H$ and a supply line which carries the voltage $V_L$. This applies a provisioned offset in addition to the naturally arising offset that each comparator has and has the effect of replicating the gaussian distribution profiles shown in FIG. 3 at positions which are offset along the horizontal axis. This has the advantage of increasing the input range of the converter. FIG. 9 shows a set of four Gaussian distribution profiles $\mu_1$, $\mu_2$, $\mu_3$, $\mu_4$ offset along the horizontal axis. FIG. 10 shows the corresponding combined distribution of the set of individual distributions of FIG. 9. Advantageously, where the input signal is an ac signal with no dc offset, it is desirable to provide a first reference level of 0V, a second reference level at a positive voltage level and a third reference level at a negative voltage level. Advantageously, the provisioned offsets are of the order of tens to hundreds of millivolts (mV). FIG. 8 shows three groups of comparators 41, 42, 43, each group having a different reference level. It is possible to provide a greater number of groups of comparators, each group being provided with a different reference level. Taken to the extreme, each group can comprise only two comparators (the single comparator per group case equates to a conventional flash ADC). However, this is undesirable as the technique requires a fairly high number of comparators in each group to provide a suitable distribution of offset values. If only a few comparators are in a group, it is desirable that the offsets between groups should be small in order to guarantee that the distributions still overlap and that enough comparators are present around each level. So, with large offsets, the number in each group has to be high. With small offset differences it is possible to use a smaller number of comparators per group. It is considered advantageous to provide at least several tens of comparators per group.

Because of the Gaussian shaped distribution, the number of comparators having their zero-crossing near zero input is larger than the number of comparators with the zero-crossing further away from zero input. Therefore, the ADC has a higher accuracy (better resolution) for input signals in the amplitude range around 0V than for larger input signals. This suits the properties of, for example, wide-band signals which have a Gaussian signal amplitude distribution about 0V and feedback systems. It will be appreciated that the comparators can have a Gaussian distribution which has a non-zero mean value (i.e. the distribution is centred on a non-zero value).

In the above description, the process of deriving a Compensating Transfer Function (CTF, FIG. 5) from the Transfer Function (FIG. 4) is a linear mapping of values. This is useful if the ADC is used as a standalone device. If the ADC is integrated in combination with some non-linear pre-processing device, such as an amplifier that saturates, the CTF can correct for the non-linear behaviour of the processing device so that the output of the total system is linear. The mapping from the transfer function of FIG. 4 to the Compensating Transfer Function of FIG. 5 is non-linear in this case.

To achieve a spread of offset values among the set of comparators, it is possible to rely on variations in performance which will arise from the IC fabrication process. So, although every comparator has been designed to generate an output at exactly the same combination of reference voltage and input signal, the fabrication process will introduce some variation to the response which is sufficient to give a suitable spread of offset values among the set of comparators. Alternatively, the set of comparators can be purposely designed to have a non-identical response to the combination of reference voltage and input signal so, for example, some of the comparators will have more spread than others because they were designed that way.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The words "comprising" and "including" do not exclude the presence of other elements or steps than those listed in the claim. Where the system/device/apparatus claims recite several means, several of these means can be embodied by one and the same item of hardware.

In the description above, and with reference to the Figures, there is described an analog-to-digital converter comprising a signal input for receiving an analog input signal and a set of comparators. Each comparator has a first input connected to the signal input and a second input connected to a reference voltage. Each comparator generates an output based on the comparison of the signals at the first input and second input. The reference voltage is the same for all comparators. The set of comparators has a non-uniform response to the reference voltage and the input signal and is due to an internally arising offset. An adder determines a sum of the outputs of the set of comparators and conversion logic generates an output digital signal dependent on the determined sum. Multiple sets of comparators can be provided, each set having a different respective reference voltage.

The invention claimed is:

1. An analog-to-digital converter comprising:
   a signal input for receiving an analog input signal;
   a set of comparators, each comparator having a first input connected to the signal input, a second input connected to a reference voltage and being arranged to generate an output based on the comparison of the signals at the first input and second input, wherein the reference voltage is the same for all comparators in the set, and wherein the set of comparators has a non-identical response to the reference voltage and the input signal;
   an adder for determining a sum of the outputs of the set of comparators;
   conversion logic which is arranged to generate an output digital signal dependent on the determined sum.

2. A converter according to claim 1 comprising N sets of comparators (where N>=2), each of the sets of comparators being provided with a different reference voltage, and wherein the adder is arranged to determine a sum of the outputs of the N sets of comparators.

3. A converter according to claim 2 wherein a first of the reference voltages is substantially equal to zero, and the other reference voltages are distributed each side of the first reference voltage.

4. A converter according to claim 2 wherein each set of comparators comprises a substantially equal number of comparators.

5. A converter according to claim 2, wherein each set of comparators comprises at least ten comparators.

6. A converter according to claim 1, wherein the conversion logic comprises a look-up table which stores a relationship between a range of possible values output by the adder and a corresponding digital code for each value.

7. A converter according to claim 1, wherein the conversion logic has been calibrated by applying a set of calibration signals of known value to the signal input of the converter and recording an output of the adder for each calibration signal.

8. A converter according to claim 7 further comprising calibration apparatus for calibrating the converter.

9. An analog-to-digital converter comprising:
   a signal input for receiving an analog input signal;
   a set of comparators, each comparator having a first input connected to the signal input, a second input connected to a reference voltage and being arranged to generate an output based on the comparison of the signals at the first input and second input, wherein the reference voltage is the same for all comparators in the set, and wherein the set of comparators has a non-identical response to the reference voltage and the input signal;
   an adder for determining a sum of the outputs of the set of comparators;
   conversion logic which is arranged to generate an output digital signal dependent on the determined sum based on a relationship between a sub-set of the total set of possible values that can be output by the adder and a corresponding digital code for each value and wherein the conversion logic is arranged to use an interpolation function to determine a digital code where the number of adders is not part of the sub-set of values stored in the look-up table.

10. A method of calibrating an analog-to-digital converter according to any one of the preceding claims, comprising:
    applying a set of calibration signals of known value to the signal input of the converter and recording an output of the adder for each calibration signal.

11. A method of performing analog-to-digital conversion of an analog input signal comprising:
    receiving the analog input signal;
    applying the input signal to a first input of each of a set of comparators;
    applying a reference voltage to a second input of each of the set of comparators, each comparator being arranged to generate an output based on the comparison of the signals at the first input and second input and wherein the set of comparators has a non-identical response to the reference voltage and the input signal;
    determining a sum of the outputs of the set of comparators;
    generating an output digital signal dependent on the determined sum.

12. A method according to claim 11 further comprising:
    applying the input signal to the N sets of comparators (where N>=2);
    applying a different reference voltage to each set of comparators; and
    determining a sum of the outputs of all of the N sets of comparators.

* * * * *